United States Patent
Xue

(10) Patent No.: US 10,061,447 B2
(45) Date of Patent: Aug. 28, 2018

(54) FLEXIBLE TRANSPARENT CONDUCTIVE COATING AND METHOD OF MAKING THEREOF

(71) Applicant: SAMSUNG DISPLAY CO., LTD., Yongin, Gyeonggi-Do (KR)

(72) Inventor: Jiuzhi Xue, Broomfield, CO (US)

(73) Assignee: Samsung Display Co., Ltd., Yongin-si (KR)

( * ) Notice: Subject to any disclaimer, the term of this patent is extended or adjusted under 35 U.S.C. 154(b) by 250 days.

(21) Appl. No.: 14/806,557

(22) Filed: Jul. 22, 2015

(65) Prior Publication Data

US 2016/0034062 A1 Feb. 4, 2016

Related U.S. Application Data

(60) Provisional application No. 62/031,782, filed on Jul. 31, 2014.

(51) Int. Cl.
*G06F 3/041* (2006.01)
*H05K 1/09* (2006.01)
(Continued)

(52) U.S. Cl.
CPC ........... *G06F 3/044* (2013.01); *H05K 3/1241* (2013.01); *G06F 2203/04102* (2013.01);
(Continued)

(58) Field of Classification Search
CPC . G06F 2203/04102; G06F 2203/04103; G06F 2203/04112; G06F 3/044;
(Continued)

(56) References Cited

U.S. PATENT DOCUMENTS

| | | | |
|---|---|---|---|
| 2010/0207891 A1* | 8/2010 | Wang | G06F 3/044 345/173 |
| 2013/0242485 A1* | 9/2013 | Ohtani | G06F 3/041 361/679.01 |
| 2014/0098046 A1* | 4/2014 | Tenuta | G08B 6/00 345/173 |
| 2014/0152917 A1* | 6/2014 | Lee | G06F 3/044 349/12 |
| 2014/0209355 A1* | 7/2014 | Lebens | H05K 1/0296 174/250 |
| 2014/0216790 A1* | 8/2014 | Trauernicht | G06F 3/044 174/253 |
| 2014/0332256 A1* | 11/2014 | Cok | H05K 1/0274 174/253 |
| 2015/0022736 A1* | 1/2015 | Kim | H05K 1/0274 349/12 |

(Continued)

FOREIGN PATENT DOCUMENTS

| KR | 10-0978200 | 8/2010 |
|---|---|---|
| KR | 10-1155450 | 7/2012 |
| KR | 10-1424603 B1 | 8/2014 |

OTHER PUBLICATIONS

KR 10-2009-0000525 A, published Jan. 7, 2009 corresponds to KR Registration No. 10-0978200, published Aug. 25, 2010 as set forth above.

(Continued)

*Primary Examiner* — Hong Zhou
(74) *Attorney, Agent, or Firm* — Lewis Roca Rothgerber Christie LLP

(57) ABSTRACT

A flexible conductive coating including: a first plurality of conductive traces extending in a first direction and a second plurality of conductive traces, each of the conductive traces including metal nanoparticles and ones of the second plurality of conductive traces being electrically coupled to ones of the first plurality of conductive traces, wherein each of the first plurality of conductive traces includes two substantially parallel long sides and two rounded short sides connecting the two long sides, and wherein more of the metal nanoparticles are at an outer edge of each of the conductive traces than are at an inner region bounded by the sides of each of the conductive traces.

8 Claims, 8 Drawing Sheets

(51) Int. Cl.
*H05K 1/02* (2006.01)
*G06F 3/044* (2006.01)
*H05K 3/12* (2006.01)

(52) U.S. Cl.
CPC .............. *G06F 2203/04103* (2013.01); *G06F 2203/04112* (2013.01); *H05K 1/0296* (2013.01); *H05K 3/125* (2013.01); *H05K 2201/0108* (2013.01); *H05K 2201/09681* (2013.01); *H05K 2203/0126* (2013.01); *H05K 2203/1131* (2013.01); *H05K 2203/1476* (2013.01)

(58) Field of Classification Search
CPC ......... H05K 1/0296; H05K 2201/0108; H05K 2201/09681; H05K 2203/0126; H05K 2203/1131; H05K 2203/1476; H05K 3/1241; H05K 3/125
See application file for complete search history.

(56) References Cited

U.S. PATENT DOCUMENTS

2015/0085456 A1* 3/2015 Cok .................... H05K 1/0274
                                                           361/767
2015/0212613 A1* 7/2015 Fowlkes ................ G06F 3/046
                                                           345/173

OTHER PUBLICATIONS

KR 10-2011-0086940 A, published Aug. 2, 2011 corresponds to KR Registration No. 10-1155450, published Jul. 19, 2012 as set forth above.

* cited by examiner

FLEXIBLE TRANSPARENT CONDUCTIVE COATING AND METHOD OF MAKING THEREOF

CROSS-REFERENCE TO RELATED APPLICATION

The present application claims priority to and the benefit of U.S. Provisional Patent Application Ser. No. 62/031,782, entitled "FLEXIBLE TRANSPARENT CONDUCTIVE COATING AND METHOD OF MAKING THEREOF," filed in the United States Patent and Trademark Office on Jul. 31, 2014, the entire content of which is incorporated herein by reference.

BACKGROUND

1. Field

Embodiments of the present invention relate to a flexible transparent conductive coating and a method of making the same.

2. Related Art

Conductive coatings are commonly found in modern electronic devices. Conductive coatings can be used to transmit electrical signals between components or can be used as a sensor, for example, to detect the presence of objects. When used in display devices, such as organic light emitting diode (OLED) displays, liquid crystal displays (LCDs), plasma display panels (PDPs), and the like, the conductive coatings may be transparent so as to not interfere with light emitted from the display panel.

Furthermore, touch panels may utilize conductive coatings to detect a touch by, for example, a stylus device or a human finger. Touch panels can be either resistive-type or conductive-type, for example. When the touch panel is used in conjunction with a display device, such as in a smart phone or a touch-screen display, various elements of the touch panel, such as the electrodes, should be transparent so an image displayed by the display device is visible to a user through the touch panel.

Recently, flexible display devices have become popular. Flexible display devices can be, for example, continuously flexible, that is, a user may freely flex the display device into a particular shape or orientation, or may be curved, that is, the display device may be manufactured flat but then bent to have a curvature (e.g., a preset curvature) in use.

There is a desire to use the touch panel in conjunction with the flexible display device, in which case the touch panel is desirably flexible as well as transparent while reducing or preventing degradation of displayed images due to the touch panel.

Conventionally, indium tin oxide (ITO) has been used as a transparent conductive material in, for example, touch panels and display devices. However, ITO includes rare earth materials (e.g., rare earth elements or rare earth metals) and, therefore, is relatively expensive. In addition, ITO is brittle and, thus, is not best suited for use in flexible devices.

Generally, reduction of sheet resistance (e.g., reduction in the resistance of a conductive sheet or coating) comes at the expense of reduced light transmittance. That is, generally, sheet resistance increases when greater light transmittance through the sheet is desired. Various approaches have been proposed to reduce sheet resistance without substantially reducing light transmittance therethrough, each having their own drawbacks. For example, metal meshes have been proposed. However, while metal meshes may have relatively high light transmittance and reduced sheet resistance, the metal mesh may be visible, causing, for example, a moiré pattern to be visible to a viewer.

The above information disclosed in this Background section is only for enhancement of understanding of the background of the invention, and therefore, it may contain information that does not form prior art.

SUMMARY

Aspects of embodiments of the present invention include a flexible transparent conductive coating and a method of making the flexible transparent conductive coating.

According to some embodiments of the present invention, a flexible conductive coating includes: a first plurality of conductive traces extending in a first direction and a second plurality of conductive traces, each of the conductive traces including metal nanoparticles and ones of the second plurality of conductive traces being electrically coupled to ones of the first plurality of conductive traces, wherein each of the first plurality of conductive traces includes substantially parallel long sides and connecting short sides which may be curved or straight.

The metal nanoparticles may include silver (Ag) or copper (Cu).

According to some embodiments of the present invention, a touch panel includes: a substrate; a first plurality of conductive traces extending in a first direction, each of the first plurality of conductive traces includes two substantially parallel long sides and two rounded short sides connecting the two long sides; and a second plurality of conductive traces, ones of the second plurality of conductive traces electrically coupling adjacent ones of the first plurality of conductive traces, wherein each of the conductive traces includes metal nanoparticles, with more of the metal nanoparticles at an outer edge of the respective conductive trace than at an inner region bounded by the sides of the respective conductive traces.

The second plurality of conductive traces may extend in a second direction that is different from the first direction, and each of the second plurality of conductive traces may cross at least two of the first plurality of conductive traces.

Each of the second plurality of conductive traces may have a generally circular shape and may be between the adjacent ones of the first plurality of conductive traces.

Ones of the first plurality of the conductive traces may have lengths that are different from each other.

Ones of the first plurality of the conductive traces may have widths that are different from each other.

At least one of the first plurality of the conductive traces may have a width that varies.

At least one of the first plurality of conductive traces and at least one of the second plurality of conductive traces may cross to form an obtuse angle.

According to some embodiments of the present invention, a method of making a flexible conductive coating includes: depositing a plurality of continuous lines of a solution on a substrate along a first direction, the solution including a solvent and metal nanoparticles; and depositing the solution on the substrate along a second direction, wherein the deposited continuous lines form first conductive traces, each of the first conductive traces includes two substantially parallel long sides and two rounded short sides connecting the two long sides, and more of the metal nanoparticles are at an outer edge of each of the first conductive traces than are at an inner region bounded by the sides of the respective first conductive trace.

The solution deposited along the second direction may be deposited as dots.

The dots may be deposited outside the first conductive traces.

The dots may form substantially circular-shaped second conductive traces, and the second conductive traces may contact adjacent ones of the first conductive traces.

The dots may be deposited both outside and at the inner region of the first conductive traces.

The dots may form substantially circular-shaped second conductive traces, and the second conductive traces may contact adjacent ones of the first conductive traces and adjacent ones of the second conductive traces.

The solution deposited along the second direction may be deposited as continuous lines.

The method may further include sintering after the depositing the plurality of continuous lines.

The method may further include sintering after the depositing the solution along the second direction.

Varying amounts of the solution may be deposited as the continuous lines such that the resulting first conductive traces have varying widths.

The metal nanoparticles may be coated with a surfactant prior to being deposited.

Accordingly, a flexible transparent conductive coating that is flexible, not visible to a user, and has a relatively low cost and a method of making the same is provided.

BRIEF DESCRIPTION OF THE DRAWINGS

A more complete appreciation of the present invention, and many of the attendant features and aspects thereof, will become more readily apparent as the invention becomes better understood by reference to the following detailed description when considered in conjunction with the accompanying drawings, in which.

DETAILED DESCRIPTION

Figure 1:
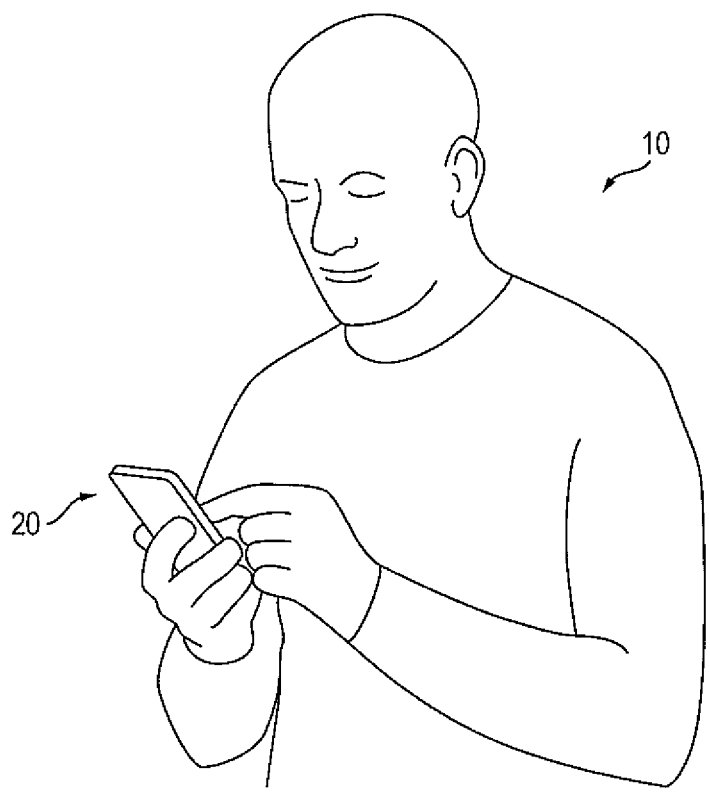
FIG. 1 illustrates a user with a mobile phone having a touch panel according to an embodiment of the present invention.

Hereinafter, example embodiments of the present invention will be described in more detail with reference to the accompanying drawings. The present invention, however, may be embodied in various different forms and should not be construed as being limited to only the embodiments illustrated herein. Rather, these embodiments are provided as examples so that this disclosure will be thorough and complete and will fully convey some of the aspects and features of the present invention to those skilled in the art. Accordingly, processes, elements, and techniques that are not necessary for those having ordinary skill in the art to have a complete understanding of the aspects and features of the present invention may not be described with respect to some of the embodiments of the present invention. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section described below could be termed a second element, component, region, layer, or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions, such as "at least one of," when preceding a list of elements, modify the entire list of elements and do not modify the individual elements of the list. Further, the use of "may" when describing embodiments of the present invention refers to "one or more embodiments of the present invention." Also, the term "exemplary" is intended to refer to an example or illustration.

It will be understood that when an element or layer is referred to as being "on," "connected to," "coupled to," or "adjacent to" another element or layer, it can be directly on, connected to, coupled to, or adjacent to the other element or layer, or one or more intervening elements or layers may be present. However, when an element or layer is referred to as being "directly on," "directly connected to," "directly coupled to," or "immediately adjacent to" another element or layer, there are no intervening elements or layers present.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The processing circuit(s) and/or any other relevant devices or components according to embodiments of the present invention described herein may be implemented utilizing any suitable hardware, firmware (e.g., an application-specific integrated circuit), software, or a suitable combination of software, firmware, and hardware. For example, the various components of the processing circuit(s) may be formed on one integrated circuit (IC) chip or on separate IC chips. Further, the various components of the processing circuit(s) may be implemented on a flexible printed circuit film, a tape carrier package (TCP), a printed circuit board (PCB), or formed on a same substrate as the processing circuit(s). Further, the various components of the processing circuit(s) may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

According to embodiments of the present invention, a conductive coating is provided that is both flexible and transparent. The conductive coating can be used, for example, in a touch panel to sense touch input by a human finger or another object. Due to the flexibility and transparent qualities of the conductive coating, the touch panel using the same can be employed with a flexible display device to form a flexible display device having touch functionality.

The conductive coating may include (e.g., may be formed of) metal nanoparticles, for example, silver (Ag) and/or copper (Cu) nanoparticles. The conductive coating may be formed by using a printing method in which a solution including a solvent and the metal nanoparticles is deposited (e.g., printed) onto a substrate.

The deposited solution then spreads on the substrate due to, for example, natural wetting between the solution and the substrate. As will be further described below, the solvent then evaporates, leaving the metal nanoparticles on the substrate. The metal nanoparticles form a generally oval shape due to the "coffee ring effect" that occurs when a particle-laden solution evaporates.

Accordingly, the conductive coating on the substrate has good flexibility and transparency and can be easily manufactured.

Referring to FIG. 1, a user 10 is illustrated using a mobile phone 20 having a touch screen by touching the screen with his finger. By touching the touch screen, the user 10 interacts with the various images and text displayed on a display positioned under the touch screen and, thus, can interact with the mobile phone 20 without using an additional device, such as a stylus or a keyboard.

Figure 2:
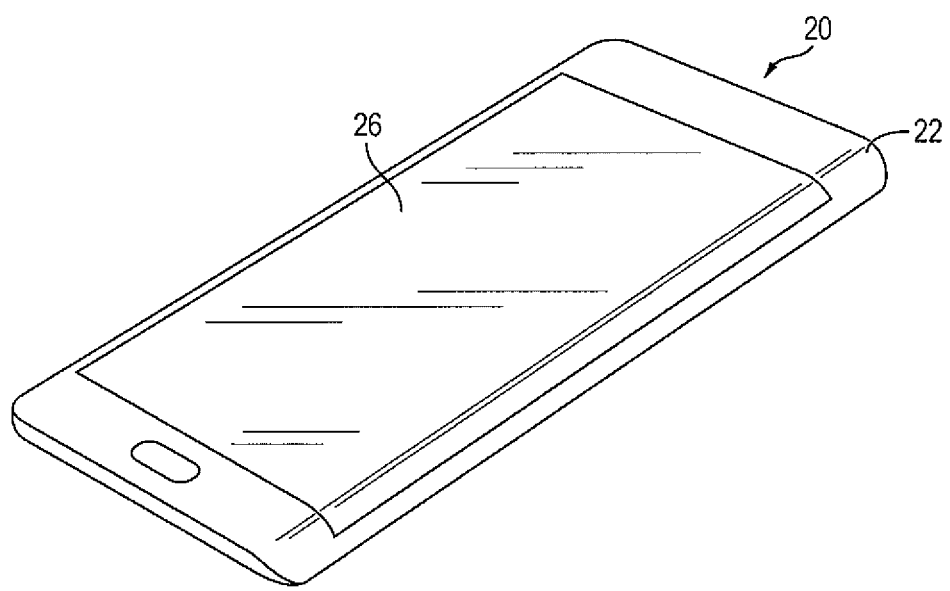
FIG. 2 illustrates the mobile phone shown in FIG. 1.

Recently, flexible and/or curved mobile phones have become popular. As shown in FIG. 2, the mobile phone 20 includes the display with the touch screen 26 and has a curved edge 22. The display with the touch screen 26 extends onto the curved edge 22 of the mobile phone 20, such that the display with the touch screen 26 is also curved (e.g., is curved to the same or substantially the same degree as the curved edge 22 of the mobile phone 20). While the mobile phone 20 is illustrated having only one curved edge 22, in other embodiments, the mobile phone or other device may include two or more curved edges.

Generally, the curved display with the touch screen 26 of the mobile phone 20 is manufactured in a flat or planar state and is then bent to the desired shape and/or orientation. Accordingly, the various elements of the display and the touch panel are flexible so they can bend from the flat state to the curved shape or orientation without affecting their performance. For example, various conductive traces should be able to bend or flex (e.g., bend or flex to a certain degree) without breaking (e.g., without becoming electrically disconnected with another portion of the respective conductive trace).

As another example, some displays and touch panels are continuously flexible. That is, all components or elements of the display or the touch panel may be flexible and not have one set shape and/or orientation but instead be able to be adjusted into a plurality of different shapes and/or orientations by a user. For example, a display may be rolled up into a roll shape or folded into a folded shape when not in use and then unrolled or unfolded by a user when the user wishes to use the display, similar to a traditional newspaper. The display may further include a touch panel so the user can then interact with the display once it is unrolled or unfolded. Accordingly, the various components or elements of the display and the touch panel, such as the conductive traces, should be able to be repeatedly bent or flexed without breaking.

Figure 3:
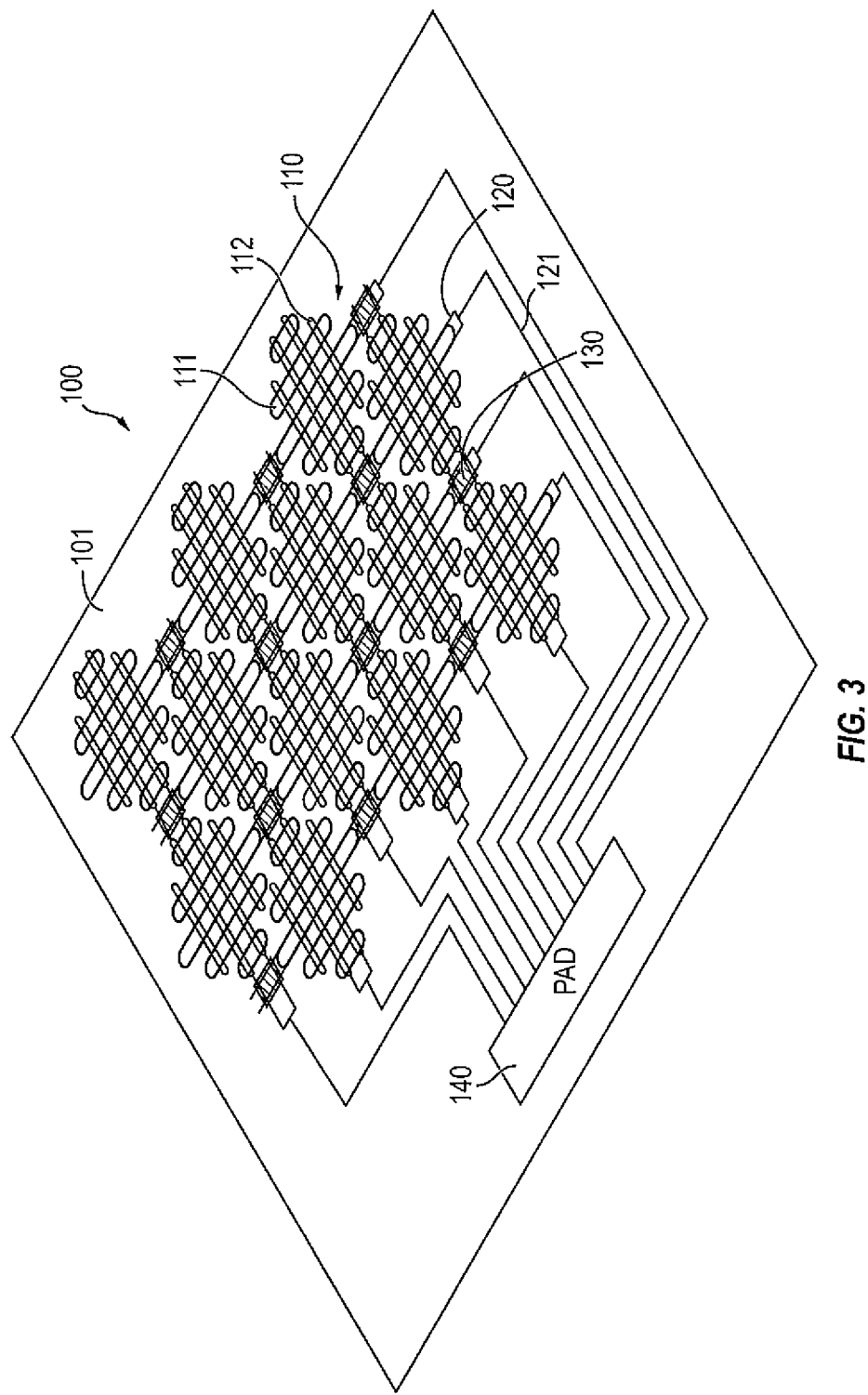
FIG. 3 illustrates a touch panel according to an embodiment of the present invention.

Referring to FIG. 3, a touch panel 100 including a flexible conductive coating 110 according to an embodiment of the present invention is shown. The touch panel 100 includes a substrate 101, the flexible conductive coating 110 on the substrate 101, connecting traces 120 coupled to (e.g., electrically coupled to) the flexible conductive coating 110, insulation pads 130 between overlapping connecting traces 120, and a PAD 140.

The flexible conductive coating 110 is formed (e.g., deposited) into any suitable desired shape during manufacturing thereof, to be further described later. In FIG. 3, the flexible conductive coating 110 is formed to include horizontal traces 111 (e.g., a first plurality of conductive traces) and vertical traces 112 (e.g., a second plurality of conductive traces). However, the present invention is not limited thereto, and the conductive coating 110 can have any suitable shape and the various traces of the conductive coating 110 can be arranged in any suitable alignment. Further, groups of the horizontal and vertical traces 111 and 112 may together form a plurality of diamond-shaped patterns, in which the outermost traces 111 and 112 are shorter than the innermost traces 111 and 112 thereof. The traces 111 and 112 in each of the diamond-shaped patterns are electrically coupled to each other to form a single electrode. Various traces 111 and 112 of different diamond-shaped patterns may be in a same line. For example, an outermost trace of one diamond-shaped pattern may be aligned with an outermost trace of an adjacent diamond-shaped pattern. For example, the various traces 111 and 112 may be formed in a grid or matrix pattern on the substrate 101 but may have various different lengths to form the various diamond-shaped patterns. Furthermore, the horizontal traces 111 and the vertical traces 112 may not extend perpendicular to each other but may instead extend at an angle with respect to each other (e.g., an angle other than 90°) to reduce a moiré effect.

The innermost horizontal trace or traces 111 of each diamond-shaped pattern may have one or more connecting traces 120 coupled thereto. The outermost diamond-shaped pattern on the substrate 101 may have connecting traces 120 that respectively extend in a direction toward the nearest edge of the substrate 101. Furthermore, each diamond-shaped pattern may be coupled to the horizontally or vertically adjacent diamond-shaped patterns by the connecting traces 120. For example, the diamond-shaped patterns arranged along a horizontal line may be coupled to each other by respective connecting traces 120, and the diamond-shaped patterns arranged along a vertical line may be coupled to each other by respective connecting traces 120. Then, the connecting traces 120 extending from the outermost diamond-shaped patterns toward the edges of the substrate 101 are coupled to respective connecting lines 121 that extend between an end of a respective connecting trace 120 and the PAD 140. The diamond-shaped patterns of the flexible conductive coating 110 may be at a display area of the substrate 101, and the connecting lines 121 may be at a non-display area of the substrate 101 that surrounds the display area.

Between respective diamond-shaped patterns, one of the insulation pads 130 may be positioned between different (e.g., overlapping) connecting traces 120. For example, one connecting trace 120 coupling adjacent diamond-shaped patterns along the horizontal line may be on the substrate, the insulation pad 130 may be on the one connecting trace 120, and another connecting trace 120 coupling adjacent diamond-shaped patterns along the vertical line may be on the insulation pad 130. The insulation pads 130 are electrically insulative, such that the various overlapping connecting traces 120 do not interfere (e.g., electrically interfere) with each other. Furthermore, the insulation pads 130 may also be transparent.

In a touch panel according to one or more exemplary embodiments of the present invention, for example, a capacitive-type touch panel, when an object, such as a finger, a stylus pen, or the like, contacts the touch panel, a change in capacitance according to a contact position is transferred from the diamond-shaped patterns to the driving circuit (not shown) via the connecting traces 120, the connecting lines 121, and the PAD 140. In one or more embodiments, the change in capacitance is converted into an electrical signal by X and Y input processing circuits, or the like (not shown), such that the contact position is determined.

A method of manufacturing the flexible conductive coating according to embodiments of the present invention will now be described with reference to FIGS. 4A-13.

Figure 4A:
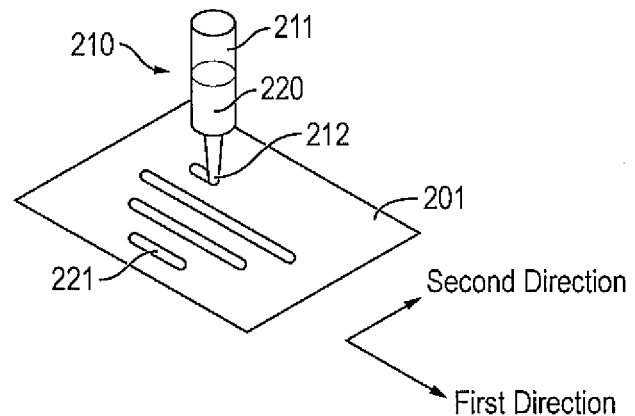
FIGS. 4A-12 illustrate steps of a method of making a conductive coating according to embodiments of the present invention.
Figure 14:
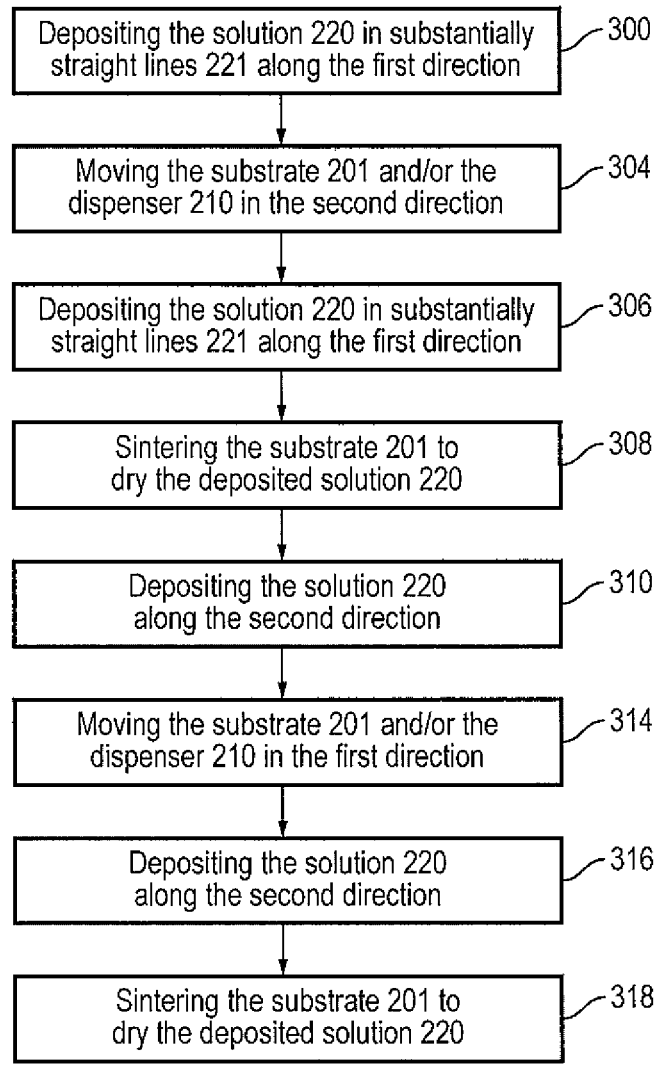
FIG. 14 is a flow diagram describing a method of manufacturing a touch panel according to embodiments of the present invention.

Referring to FIG. 4A, a first step 300 (see FIG. 14) of manufacturing the flexible conductive coating according to an embodiment of the present invention includes depositing a solution 220 onto a substrate 201 by using a dispenser 210.

The substrate 201 may be a flexible transparent substrate made of, for example, plastic, glass, or any other suitable material.

The solution 220 includes a solvent and metal nanoparticles, such as copper (Cu) and/or silver (Ag) nanoparticles, suspended in the solvent. The metal nanoparticles may be coated with a surfactant so the metal nanoparticles may be evenly or more evenly dispersed in the solvent. For example, the metal nanoparticles may be evenly dispersed in the solvent both when it is in the dispenser 210 (e.g., prior to dispersion) and also immediately after it is dispensed onto the substrate 201.

The dispenser 210 may be a printer, for example, an inkjet printer, having a container 211 for storing the solution 220 and a nozzle 212 for accurately depositing the solution 220 on the substrate 201. However, the present invention is not limited thereto, and any suitable method of dispensing the solution 220 onto the substrate 201 may be used, such as a micro gravure method.

The solution 220 is deposited onto the substrate 201 as continuous and substantially straight lines 221 (e.g., in linear directions). To this end, the substrate 201 and/or the dispenser 210 may move relative to the other, and the nozzle 212 of the dispenser 210 is controlled to start and stop the flow of the solution 220 onto the substrate 201. To form the above-described diamond-shaped patterns, the dispenser 210 may move in a linear direction (e.g., a first direction) above the substrate 201 while the nozzle 212 is controlled to alternately start and stop the flow. Thus, a plurality of continuous lines 221 of the solution 220 may be formed on the substrate 201 in the first direction, and the length of each of the lines 221 of the solution 220 may be determined (e.g., controlled) by the speed of the dispenser 210 relative to the substrate 201 and/or the amount of time the nozzle 212 dispenses the solution 220.

Once the dispenser 210 reaches an end of the substrate 201 in the first direction, according to a next step of the manufacturing process 304 (see FIG. 14), the dispenser 210 or the substrate 201 may move in a second direction that is substantially perpendicular to the first direction (e.g., perpendicular to the extension direction of the previously-deposited lines of the solution 220) while the nozzle 212 is controlled to stop the flow of the solution 220.

Then, according to a next step of the manufacturing process 306 (see FIG. 14), the dispenser 210 and/or the substrate 201 may move in the first direction (e.g., in a direction parallel to the extension direction of the previously-deposited lines of the solution 220) until the dispenser 210 reaches an opposite end of the substrate 201 while the nozzle is controlled to alternately start and stop the flow of the solution 220. This process may be repeated until the entire area of the substrate desired to be coated by the solution 220 is coated (e.g., is coated by a plurality of lines of the solution 220).

The spacing between adjacent lines 221 of the solution 220 may be regular (e.g., adjacent lines may be spaced apart by a set or same distance) or may vary (e.g., adjacent lines may be spaced apart by different distances). Furthermore, the amount of the solution 220 deposited may be varied as the dispenser 210 and/or the substrate 201 moves. For example, the nozzle 212 may have an opening that varies in size as the dispenser 210 and/or the substrate 201 move. As another example, the dispenser 210 and/or the substrate 201 may vary their movement speed(s) to increase and/or decrease an amount of the solution 220 deposited on portions of the substrate. For example, the amount of the solution 220 at different points in one line 221 may vary and/or the amount of the solution 220 may vary between lines. By varying the spacing of the lines 221, a relative orientation of the lines, and/or the amount of the solution 220 deposited in each line or in various lines, a moiré effect may be reduced or prevented.

Figure 4B:
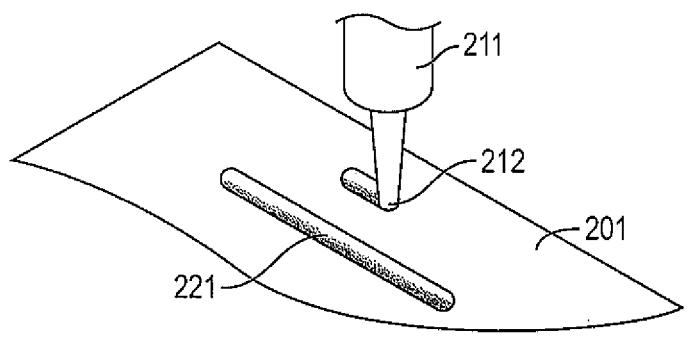

Referring to FIG. 4B, when the solution 220 is deposited onto the substrate 201, the metal nanoparticles are regularly dispersed in the solvent (e.g., the metal nanoparticles are uniformly or substantially uniformly dispersed in the solvent). In addition, the lines 221 of the solution 220 have a droplet shape (e.g., the center of the lines have a height that is greater than edges of the lines) due to a cohesive force between the molecules of the solution 220, including the solvent and the metal nanoparticles. This cohesive force is also known as surface tension.

Figure 5:
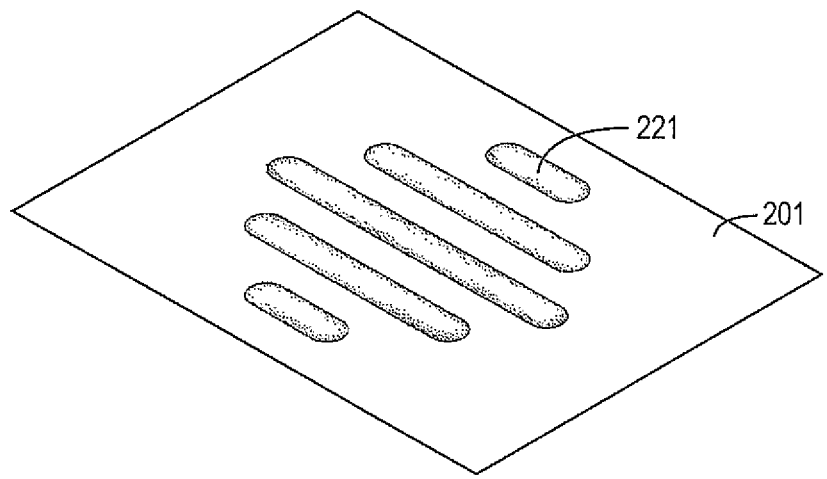

Referring to FIG. 5, after being deposited, the solution 220 begins to spread out on the substrate 201 due to an adhesive force between the molecules of the solution 220 and the substrate 201. Thus, the height of each line 221 of the solution 220 will decrease and the width of each line of the solution 220 will increase. Also, once deposited, the solvent in the solution 220 will begin to evaporate. As the solvent evaporates, the metal nanoparticles will move towards the outer edge of the line of the solution 220. This effect is known as the "coffee ring effect" and is believed to occur as a result of the solvent at the center of each line moving towards the outer edge thereof as the solution at the edge evaporates, carrying the metal nanoparticles to the edge of each line, where they are deposited when the solvent evaporates. Thus, as shown in FIG. 5, the metal nanoparticles will begin to condense or coalesce along the edges of each line 221 of the solution, forming generally oval-shaped lines with substantially straight or linear sides and rounded ends. However, when the amount of the solution 220 deposited in a line varies along its length, the metal nanoparticles may condense or coalesce into generally oval-shaped lines with curved or wavy sides and rounded ends.

Figure 6:
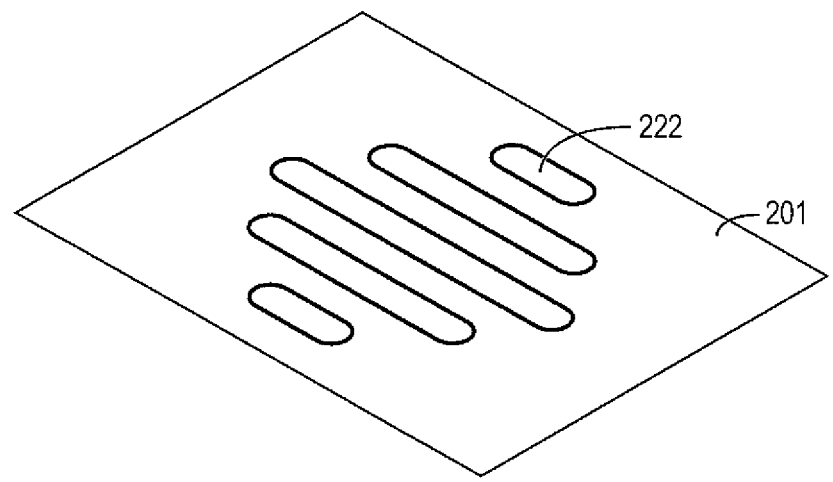
Figure 13:
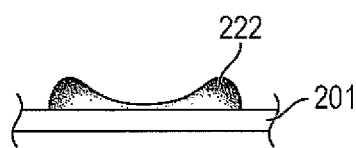
FIG. 13 is a cross-sectional view of a conductive trace according to an embodiment of the present invention.

Referring to FIG. 6, after an amount of time, all or substantially all of the solvent will evaporate from the substrate 201, leaving behind generally oval-shaped conductive traces 222 comprising the metal nanoparticles from the solution 220. Due to the above-described "coffee ring effect," most of the metal nanoparticles of the solution 220 are deposited along an outer edge of the oval-shaped conductive traces 222 and relatively few metal nanoparticles are deposited within a center (e.g., a center area) of the oval-shaped conductive traces 222. FIG. 13 is a cross-sectional view of one of the conductive traces 222 showing the dispersion of the metal nanoparticles during drying. Because the oval-shaped conductive traces 222 have a generally open (e.g., empty) center or inner area, the transparency of the conductive traces 222 is improved over conventional conductive traces. Furthermore, the flexibility of the conductive traces 222 is also improved over conventional conductive traces.

Furthermore, an optional sintering process 308 (see FIG. 14) can be performed to speed up the evaporation of the solvent and to stabilize the metal nanoparticles (e.g., improve connection between adjacent metal nanoparticles).

Figure 7:
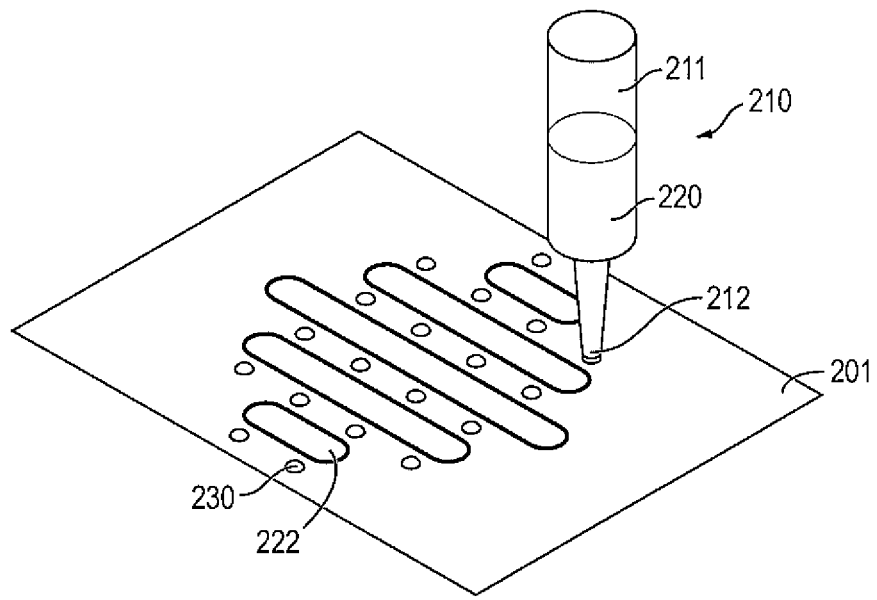

Referring to FIG. 7, after the solution 220 that forms the conductive traces 222 has dried (e.g., completely dried), dots 230 of the solution 220 are deposited by the dispenser 210 on the substrate 201 between adjacent ones of the conductive traces 222. In another embodiment, the dots 230 of the solution 220 are deposited before the solution that forms the conductive traces 222 has dried. When first deposited, the dots 230 may not contact adjacent conductive traces 222.

Depending on the size of the desired conductive coating or pattern (e.g., layer) to be formed, dots 230 can also be deposited outside the outermost conductive traces 222 as shown in FIG. 7.

The process for depositing the dots 230 may be the same or substantially similar to the above-described process for forming the conductive traces 222. For example, according to a next step 310 (see FIG. 14) of the manufacturing process, the dispenser 210 and/or the substrate 201 may move in the second direction (e.g., in a direction perpendicular or substantially perpendicular to the extending direction of the conductive traces 222) while the dispenser 210 dispenses the dots 230. In another embodiment, the dispenser 210 and/or the substrate 201 may move in the first direction while the dispenser 210 dispenses the dots 230. However, the present invention is not limited thereto, and the dots 230 may be dispensed along (e.g., arranged along) lines that are neither perpendicular nor parallel with the conductive traces 222. For example, the dots 230 may be dispensed along lines that extend at a 45° angle with respect to the conductive traces 222. As another example, the dots 230 may be randomly dispensed between and surrounding the conductive traces 222. The same solution 220 may be dispensed from the dispenser 210 to form the dots 230, or a different solution may be used. As the dispenser 210 and/or the substrate 201 move relative to each other, the nozzle 212 of the dispenser 210 is controlled to start and stop the flow of the solution 220 therethrough to deposit the solution as the dots 230 at desired locations on the substrate 201. For example, according to a step 314 (see FIG. 14), upon reaching one edge of the substrate 201, the substrate 201 and/or the dispenser 210 may move in a direction opposite to the dispensing direction of the dots 230 while not dispensing the dots 230. Then, according to a next step 316 (see FIG. 14), the substrate 201 and/or the dispenser 210 may move in the dispensing direction while dispensing the dots 230 at the desired locations on the substrate 201.

When the solution 220 is used to form the dots 230, the dots 230 will undergo the same or a substantially similar wetting and drying process as the solution 220 that previously formed the conductive traces 222, described above. For example, referring to FIG. 7, the dots 230 will have the curved shape (e.g., a droplet shape, an arc shape, etc.) when they are first deposited due to the surface tension of the solution 220.

Figure 8:
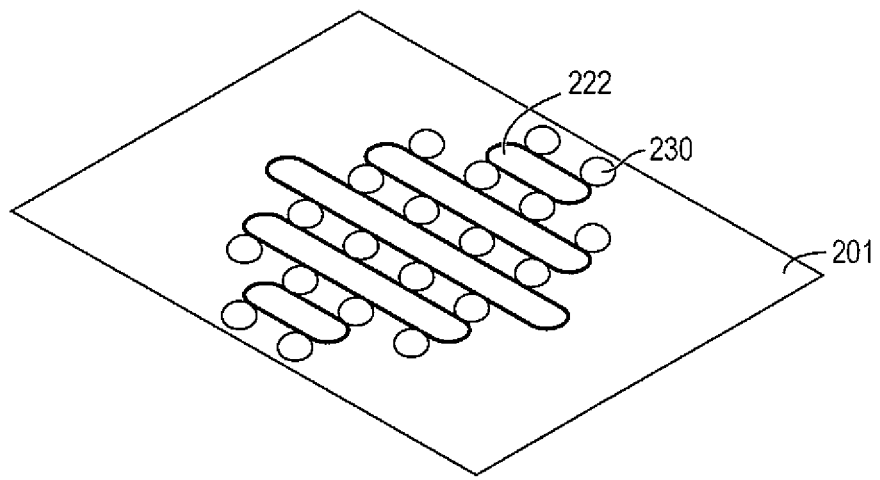

Referring to FIG. 8, the dots 230 will then begin to spread out over the substrate 201 due to, for example, wetting. During this process, a footprint of each of the dots 230 will increase on the substrate 201 while a height of each of the dots 230 decreases. Each dot 230 includes an amount of the solution 220 and/or is positioned such that, when the dots 230 spread out due to, for example, wetting, the dots 230 that are between adjacent conductive traces 222 contact at least one of (or both of) the respective adjacent conductive traces 222 and the dots 230 that are adjacent to the outermost conductive traces 222 contact the respective adjacent conductive trace 222.

Figure 9:
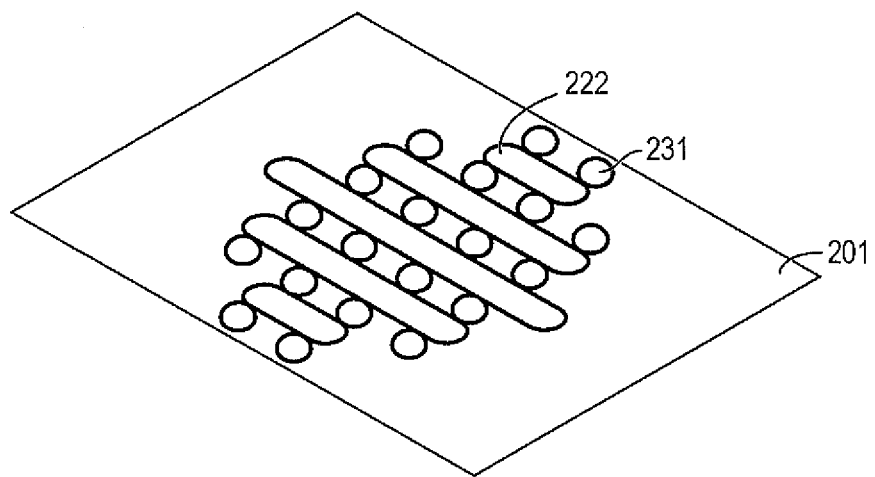

Referring to FIG. 9, after an amount of time, all or substantially all of the solvent of the solution 220 of each dot 230 will evaporate from the substrate 201, leaving behind generally circle-shaped conductive traces 231. Because the same or a substantially similar solution 220 is used to form the dots 230, the same "coffee ring effect" described above occurs in each of the dots 230. That is, as the solvent of the solution 220 evaporates, the metal nanoparticles suspended in the solvent are moved (e.g., pumped) to an outer edge of each dot 230. Once all or substantially all of the solvent has evaporated from the substrate 201, the circle-shaped conductive traces 231 remain on the substrate 201 and most of the metal nanoparticles of the solution 220 are deposited along an outer edge of the circle-shaped conductive traces 231 and relatively few metal nanoparticles are deposited within a center (e.g., a center or inner area) of the circle-shaped conductive traces 231.

Furthermore, as with the conductive traces 222, an optional sintering process (step 318) may be performed after the dots 230 are deposited on the substrate 201. The sintering process may expedite the evaporation of the solvent from the substrate 201 and may stabilize the metal nanoparticles.

Because the circle-shaped conductive traces 231 each contact at least one of (or both of) the previously-formed conductive traces 222, they are coupled (e.g., electrically coupled) thereto. To form the diamond-shaped patterns of conductive traces, a plurality of conductive traces 222 and 231 are electrically coupled with each other. The diamond-shaped patterns can then each act as an electrode of, for example, a touch screen as described above with reference to FIG. 3.

Because the circle-shaped conductive traces 231 have a generally open (e.g., empty) center or inner area, the transparency of the conductive traces 231 is improved over conventional conductive traces. Furthermore, the flexibility of the conductive traces 231 is also improved over conventional conductive traces.

Because all of the conductive traces 222 and 231 are formed using the same or a substantially similar process and using the same or a substantially similar solution 220, the flexibility and transparency of the entire conductive coating is improved over conventional conductive coatings while the cost and complexity of manufacture of the conductive coating is reduced compared to conventional conductive coatings.

Figure 10:
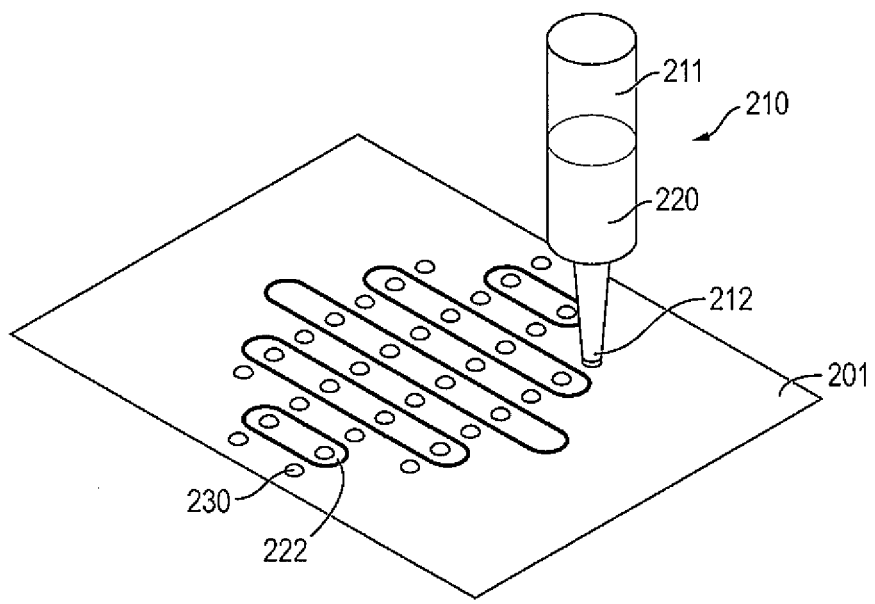

Referring to FIG. 10, according to another embodiment of the present invention, in addition to being deposited between the previously-formed conductive traces 222 as described above, dots 230 may also be deposited on (e.g., within) the previously-formed conductive traces 222. By additionally depositing the dots 230 on the conductive traces 222, the electrical coupling between the conductive traces 222 and 231 can be further ensured without substantially impacting the flexibility or transparency of the conductive coating.

Figure 11:
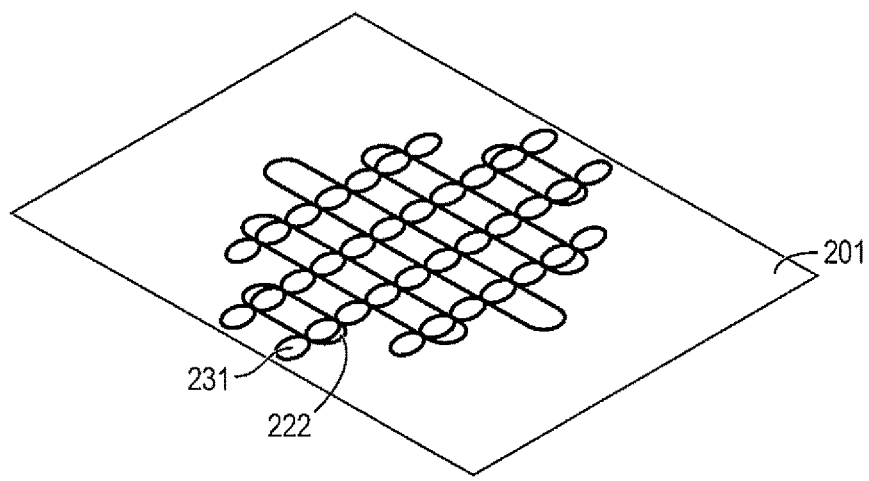

Referring to FIG. 11, in this embodiment, each of the deposited dots 230 will contact at least one adjacent dot 230. Due to surface tension, the contacted dots 230 will spread out into generally elongated oval shapes 231 as they dry. Thus, the resulting conductive traces 231 may be connected in lines in a direction substantially perpendicular to the conductive traces 222 and widths of the conductive traces 231 may vary.

Figure 12:
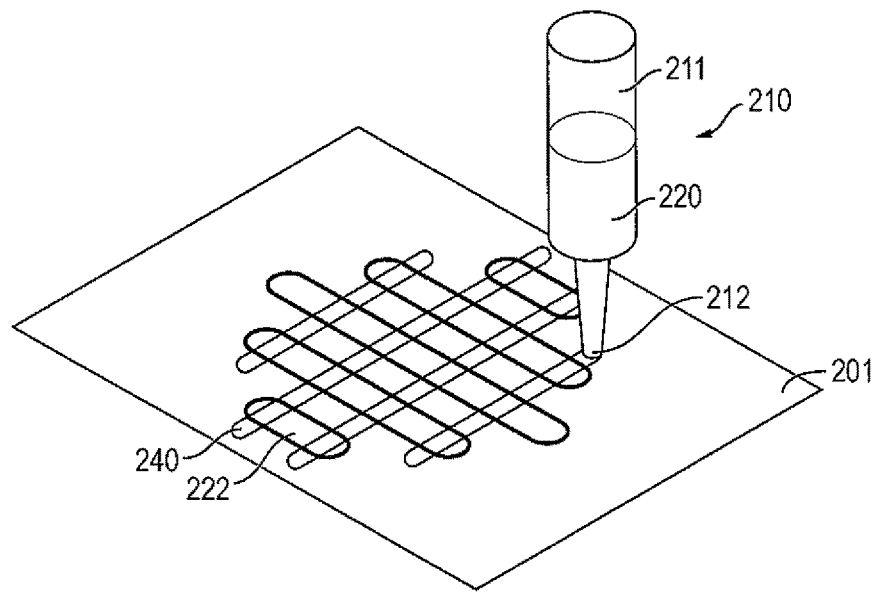

Referring to FIG. 12, according to another embodiment of the present invention, instead of dots 230 of the solution 220 being deposited on the substrate 201, continuous lines 240 of the solution 220 may be deposited on the substrate 201 by the dispenser 210. The lines 240 may be dispensed along a direction perpendicular or substantially perpendicular to the conductive traces 222. However, the present invention is not limited thereto, and the lines 240 may extend in any direction with respect to the conductive traces 222. Furthermore, as with the lines of the solution 220 that form the conductive traces 222, the width of the lines 240 may be constant or may vary locally or may vary with respect to each other. Also, the conductive traces formed by the lines 240 may have the same or a different width than the conductive traces 222.

The lines 240 of the solution 220 will undergo the same processes of wetting and evaporation of the solvent as described above with respect to the lines 221. Thus, these same processes will not be described again. Furthermore, the optional sintering process can be performed after the lines 240 are deposited on the substrate 201.

Because the lines 240 will dry into conductive traces similar to conductive traces 222, the same flexibility and transparency of the conductive traces 222 can be achieved while the electrical coupling between traces can be ensured.

Figure 15:
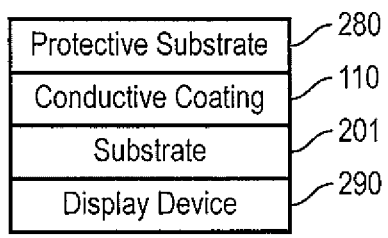
FIG. 15 is a cross-sectional diagram illustrating an embodiment of the present invention.

Referring to FIG. 15, an example embodiment of the present invention includes a display device 290, such as an organic light emitting diode (OLED) display, a liquid crystal displace (LCD), or the like, provided under the substrate 201. While not shown in FIG. 15, circuitry for detecting, transmitting, and/or processing touch inputs may be implemented on or adjacent to the substrate 201 as those skilled in the art would appreciate. A conductive coating, such as the conductive coating 110 described above, may be formed on the substrate 201, and a protective substrate 280, made of plastic, glass, or another suitable material, may be included over the conductive coating to protect the conductive coating while not interfering with the function of the conductive coating.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims and equivalents thereof.

What is claimed is:

1. A touch panel comprising:
   a substrate;
   a first plurality of conductive traces extending in a first direction and being directly on an upper surface of the substrate, each of the first plurality of conductive traces comprises two substantially parallel long sides and two rounded short sides connecting the two long sides, a lowest portion of the first plurality of conductive traces being above a highest portion of the upper surface of the substrate; and
   a second plurality of conductive traces directly on the upper surface of the substrate, ones of the second plurality of conductive traces electrically coupling adjacent ones of the first plurality of conductive traces, a lowest portion of the second plurality of conductive traces being above the highest portion of the upper surface of the substrate,
   wherein each of the conductive traces comprises metal nanoparticles, with more of the metal nanoparticles at an outer edge of the respective conductive trace than at an inner region bounded by the sides of the respective conductive trace.

2. The touch panel of claim 1, wherein the second plurality of conductive traces extend in a second direction that is different from the first direction, and
   wherein each of the second plurality of conductive traces cross at least two of the first plurality of conductive traces.

3. The touch panel of claim 1, wherein ones of the first plurality of the conductive traces have lengths that are different from each other.

4. The touch panel of claim 1, wherein ones of the first plurality of the conductive traces have widths that are different from each other.

5. The touch panel of claim 1, wherein at least one of the first plurality of the conductive traces has a width that varies.

6. The touch panel of claim 1, wherein at least one of the first plurality of conductive traces and at least one of the second plurality of conductive traces cross to form an obtuse angle.

7. The touch panel of claim 1, wherein a portion of the second plurality of conductive traces is on an upper surface of a portion of the first plurality of conductive traces.

8. The touch panel of claim 1, wherein each of the second plurality of conductive traces has a generally circular shape between the adjacent ones of the first plurality of conductive traces.

\* \* \* \* \*